United States Patent
Champion et al.

(10) Patent No.: US 10,651,626 B2
(45) Date of Patent: May 12, 2020

(54) LASER CONTROL

(71) Applicant: Microsoft Technology Licensing, LLC, Redmond, WA (US)

(72) Inventors: Mark Champion, Kenmore, WA (US); Algird M. Gudaitis, Fall City, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/101,179

(22) Filed: Aug. 10, 2018

(65) Prior Publication Data
US 2020/0052464 A1     Feb. 13, 2020

(51) Int. Cl.
*H01S 5/068* (2006.01)
*H01S 5/06* (2006.01)
*H01S 5/00* (2006.01)

(52) U.S. Cl.
CPC ........ *H01S 5/06804* (2013.01); *H01S 5/0014* (2013.01); *H01S 5/0612* (2013.01); *H01S 5/06808* (2013.01)

(58) Field of Classification Search
CPC .. H01S 5/06804; H01S 5/0014; H01S 5/0613; H01S 5/06808
See application file for complete search history.

(56) References Cited

U.S. PATENT DOCUMENTS

| | | | |
|---|---|---|---|
| 4,796,996 A | 1/1989 | Burns | |
| 5,309,458 A | 5/1994 | Carl | |
| 5,812,572 A | 9/1998 | King et al. | |
| 6,870,867 B2 | 3/2005 | Pontis et al. | |
| 7,236,507 B2 | 6/2007 | Stewart et al. | |
| 7,822,086 B2 | 10/2010 | Brown et al. | |
| 8,605,764 B1 | 12/2013 | Rothaar et al. | |
| 9,256,154 B2 * | 2/2016 | Akagi | G03G 15/043 |
| 9,985,414 B1 | 5/2018 | Wise | |
| 2006/0146894 A1 | 7/2006 | Shin | |
| 2007/0160095 A1 * | 7/2007 | Kitagawa | H01S 5/0683 372/29.012 |
| 2011/0006124 A1 | 1/2011 | Kai | |
| 2011/0241549 A1 | 10/2011 | Wootton | |

FOREIGN PATENT DOCUMENTS

EP     0793316 A1     9/1997

OTHER PUBLICATIONS

"International Search Report and Written Opinion Issued in PCT Application No. PCT/US19/038801", dated Oct. 17, 2019, 14 Pages.

* cited by examiner

*Primary Examiner* — Armando Rodriguez
(74) *Attorney, Agent, or Firm* — Rainier Patents, P.S.

(57) ABSTRACT

The description relates to laser control. One example can include a laser that has a laser emitter configured to generate a laser beam for intervals of time (e.g., pixel times). The laser can have a compensation and control component configured to receive a predicted laser emitter temperature of the laser emitter, obtain a desired optical power for an interval, and compute a compensated electrical current for the interval utilizing multiple light to current look up tables. Individual light to current look up tables can relate to specific laser emitter temperatures.

18 Claims, 11 Drawing Sheets

LASER CONTROL

BACKGROUND

Lasers are driven by current such that more current equates to more light. However, current also causes the laser to self-heat. As the laser heats, the current required to produce a given amount of light increases. If the laser's emitter temperature is known, it should be possible to accurately determine the current required for a desired amount of light. Accurate measurement of the laser's emitter temperature is extremely difficult and takes time. The laser temperature tends to change so rapidly that it's not practical to measure the emitter temperature or by the time the emitter temperature is measured the value is stale (e.g., inaccurate). The present concepts offer techniques for predicting the laser emitter temperature in near real-time (e.g., fast enough) as well as a method for determining the amount of current required to get the desired amount of light. The high-speed temperature prediction techniques can be applied to laser-based raster image displays to produce high image quality and thereby enhance user satisfaction.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. In some cases, parentheticals are utilized after a reference number to distinguish like elements. Use of the reference number without the associated parenthetical is generic to the element. Further, the left-most numeral of each reference number conveys the FIG. and associated discussion where the reference number is first introduced.

DESCRIPTION

This description relates to controlling lasers that can be used to produce light (e.g., a laser beam). A laser can include a laser emitter that emits the laser beam. The laser can be driven with electrical current to emit optical power from the laser emitter. However, achieving a desired optical power output is dependent upon the properties of the laser, especially the temperature of the laser emitter. The temperature of the laser emitter can affect how efficiently the laser converts the electrical power to optical power (e.g., the efficiency of the laser at converting electrical energy into optical energy is dependent on laser emitter temperature). If the laser is driven at an electrical current that is not adjusted to reflect the temperature of the laser emitter, an actual optical power of the laser beam may not match the desired optical power. However, it can be difficult or impossible to accurately and quickly measure laser emitter temperature, especially when the temperature is rapidly changing.

The present concepts provide laser emitter temperature prediction models that accurately predict laser emitter temperature even when the laser emitter temperature is rapidly changing. The laser emitter temperature prediction models can utilize various sensed laser properties (e.g., laser case temperature) as input to predict the laser emitter temperature. The predicted laser emitter temperatures can be used to compute adjusted or compensated electrical currents that drive the laser so that the laser produces an actual optical power that matches (or nearly matches) the desired optical power.

Figure 1:
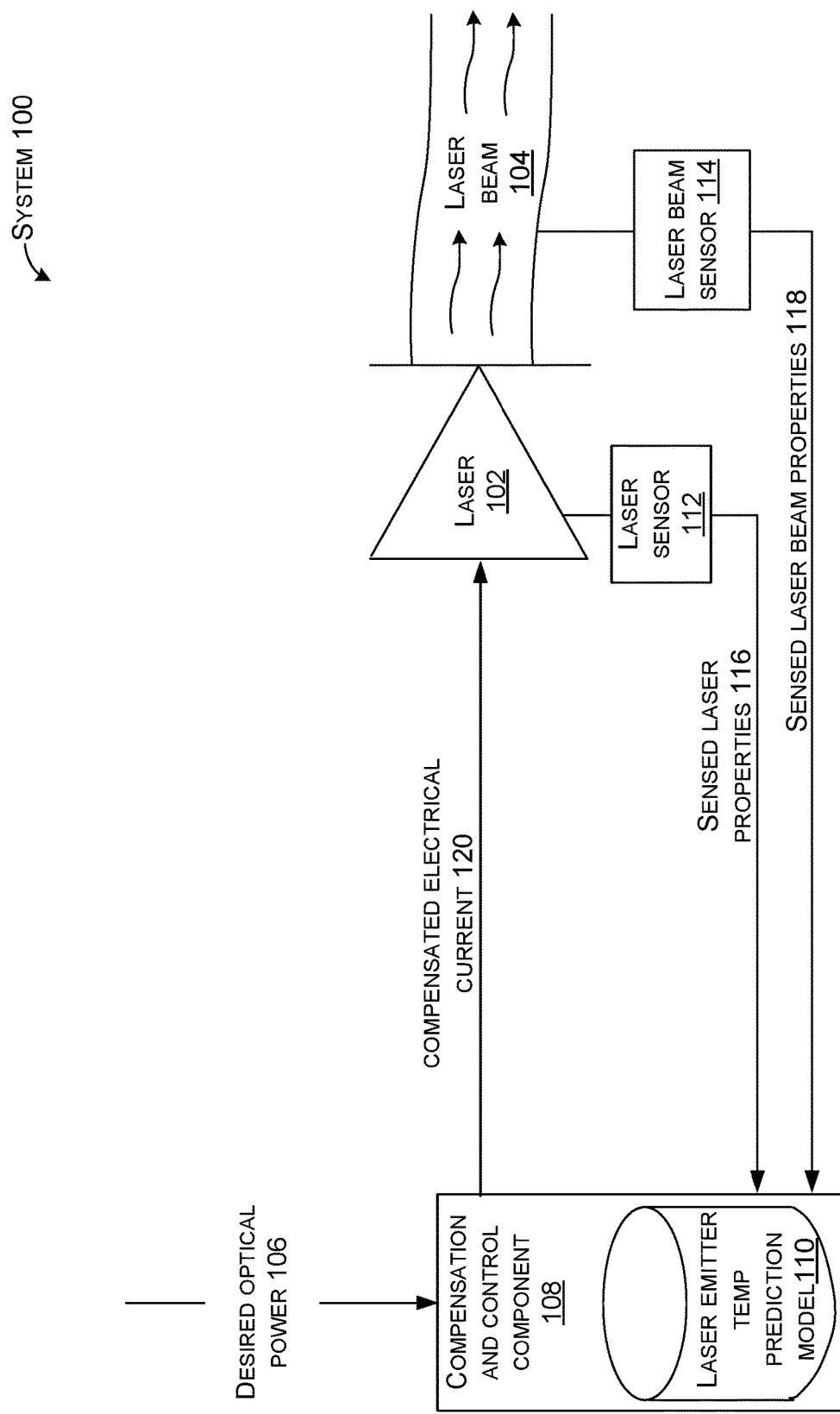
FIGS. 1-3, 5, and 7 show example systems in accordance with some implementations of the present laser control concepts.

Introductory FIG. 1 shows an example implementation of some of the present concepts on a system 100. System 100 can include a laser 102 that can produce laser beam 104. Traditionally, a desired optical power 106 would be mapped to an electrical current and the electrical current would be used to drive the laser 102 to produce laser beam 104 that has an actual optical power. The intent is for the actual optical power of the laser beam to match the desired optical power 106. However, laser emitter temperature can alter the laser efficiency produced by the mapped electrical current and thus result in a large delta between the desired optical power and the actual optical power.

The present system 100 can include a compensation and control component 108 and a laser emitter temperature prediction model 110. System 100 can also include a laser sensor 112 and a laser beam sensor 114, among other sensors. The laser sensor 112 can sense properties of the laser 102 (e.g., sensed laser properties 116, such as laser case temperature). The laser beam sensor 114 can sense properties (e.g., sensed laser beam properties 118, such as optical power and/or wavelength) of the laser beam 104. The sensed laser properties 116 and/or the sensed laser beam properties 118 can be used as input for the laser emitter temperature prediction model 110 and/or can be used as feedback to check the accuracy of the laser emitter temperature prediction model 110. In some implementations, the laser emitter temperature prediction model 110 can predict a laser emitter temperature from an input current.

The compensation and control component 108 can receive the desired optical power 106 for the laser beam 104. The compensation and control component 108 can utilize the predicted laser emitter temperature to compute a compensated electrical current 120 for driving the laser 102. The computed compensated electrical current can be specific to the predicted laser emitter temperature and thus can cause the laser beam 104 to have an actual optical power that closely matches the desired optical power 106 (e.g., small delta).

Stated another way, the temperature of the laser emitter greatly affects the optical efficiency of the laser (e.g., the percentage of electrical power input that is converted to optical power). Knowing the laser emitter temperature would allow for temperature compensation. However, it is difficult to accurately measure the temperature of the laser emitter, especially during rapid temperature change. The laser emitter temperature prediction model 110 can predict the laser emitter temperature based upon more readily sensed laser properties 116, sensed laser beam properties 118, knowledge of the input power history, and/or understanding of the thermal impedance of the laser. (Thermal impedance can reflect thermal resistance and/or thermal capacitance of the laser over time). The compensation and control component can compute the compensated electrical current 120 for the desired optical power 106 for the predicted laser emitter temperature. This technique provides a close match between the desired optical power 106 and the actual optical power of the laser beam 104.

Figure 2:
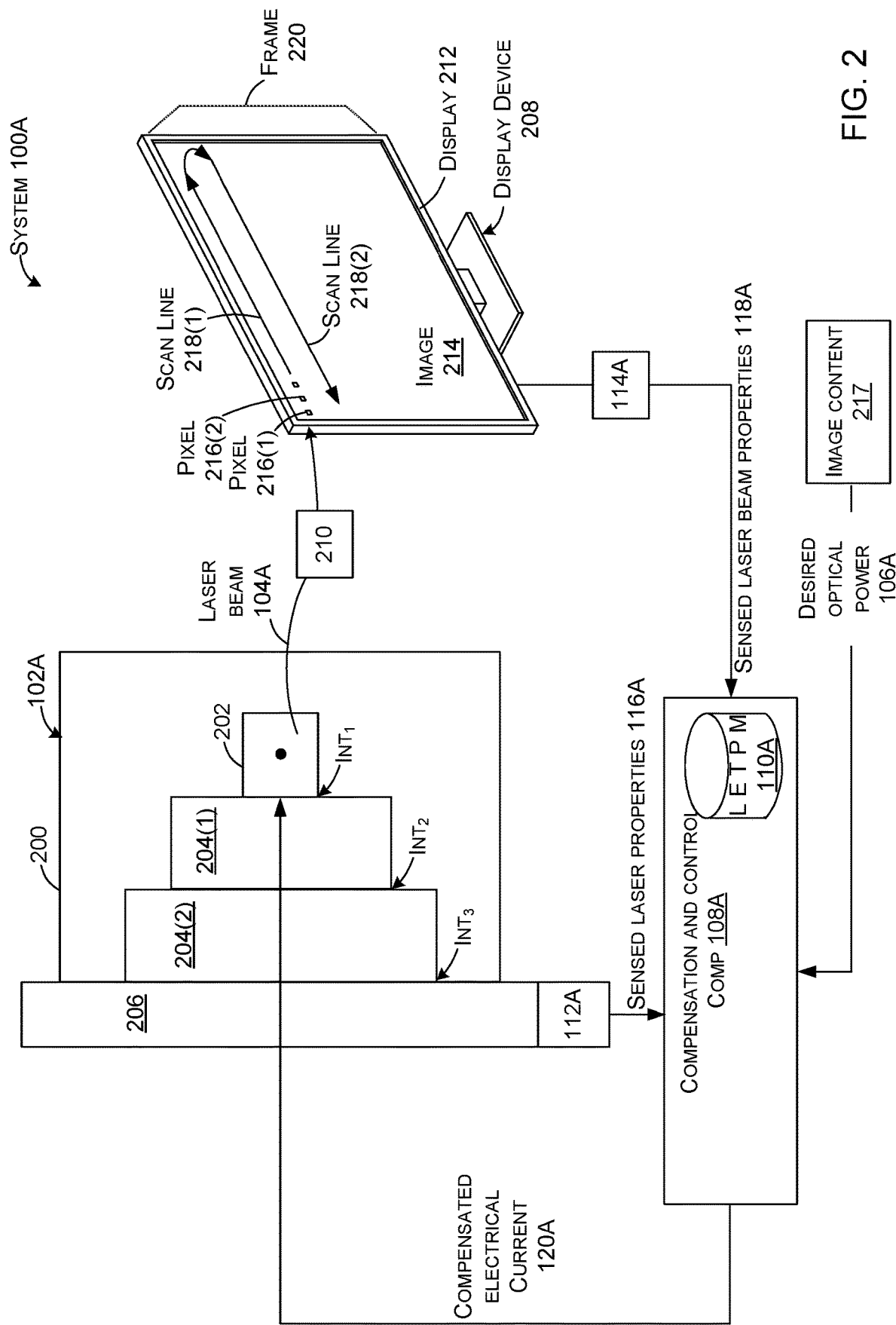

FIG. 2 shows another example system 100A that includes a laser 102A. In this case, laser 102A can include a case 200, a laser emitter 202 (e.g., emitter), one or more supporting structures 204, and/or a heat sink 206. System 100A can also include a display device 208, compensation and control component 108A and laser emitter temperature prediction model 110A. Display device 208 can also include a scanner 210 and a display 212 which can display an image 214 (e.g., raster image).

The image 214 can be made up of pixels 216. Note that the image 214 can be made up of many pixels 216, even millions of pixels 216. Only two pixels 216(1) and 216(2) are designated to avoid clutter on the drawing page. Image content 217 can define the desired optical power 106A for each pixel. In operation, the laser 102A can generate the laser beam 104A for a duration of time (e.g., pixel time) and the scanner 210 can direct the laser beam at an individual pixel 216(1) for the pixel time. The laser 102A can generate the laser beam 104A for the next pixel time and the scanner 210 can direct the laser beam at the next pixel 216(2). In many applications, the intervals are very short, such as 5 nanoseconds (ns), for example.

Through continued driving of the laser 102A for multiple pixel times (e.g., in the form of pulses or continuous waves), successive pixels 216 can be illuminated by the scanner 210. In this example, the pixels 216 can be illuminated along a scan line 218. For instance, the laser beam 104A can be used to successively illuminate pixels 216 along scan line 218(1), from left to right across the illustrated display 212. At the end of scan line 218(1), toward the right-hand side of the drawing page, the laser beam 104A can be directed down to the next scan line 218(2) and continue illuminating pixels 216 from right to left along scan line 218(2). In this manner, scanning of the laser beam 104A can continue until the image 214 covers the area of the display 212. One-time coverage of the area of the display 212 can be termed a frame 220.

Image content 217 can define the desired optical power 106A for each pixel time that the laser 102A generates the laser beam 104A. Since there can be millions of pixels in the frame and the individual pixels can be powered at different optical powers to create the image 214 the temperature of the laser emitter 202 can change greatly during the course of creating the frame. As mentioned above, due to the physical nature of the laser emitter, it is not practical to directly measure the emitter temperature of the laser emitter 202 itself, especially at a rate that is fast enough and accurate enough for emitter temperature data to be used to compensate pixel by pixel. (Recall that pixel times can be very short, such as 5 nanoseconds). Further, utilizing a single laser emitter temperature for all pixels in the frame does not allow accurate electrical current compensation for the individual pixels and can result in large deltas between the desired optical power and the actual optical power for the pixels.

The laser emitter temperature prediction model 110A can offer an effective real-time solution that can predict laser emitter temperatures as fast as a pixel-by-pixel basis (e.g., pixel time-by-pixel time basis). In some implementations, the laser emitter temperature prediction model can predict temperature behavior at a particular point on the laser 102A, such as the laser emitter 202 as a function of time and power. In some such examples, the laser emitter temperature prediction model can utilize sensed laser properties (e.g., laser case temperature), 116A and/or sensed laser beam properties (e.g., wavelength and/or optical power) 118A as input to predict the laser emitter temperature. Stated another way, the laser emitter temperature prediction model can model the thermal characteristics and the internal temperature of the laser over time.

In one such example, a temperature of heat sink 206 can be sensed by laser sensor 112A and included in sensed laser properties 116A. In some cases, the current temperature of the heat sink 206 can be considered as the case temperature of the laser. The laser emitter temperature prediction model 110A can utilize the case temperature and/or the image properties (e.g., optical power compared to thermal power) to predict the temperature of the laser emitter 202. The laser emitter temperature prediction model 110A can predict the laser emitter temperature from the case temperature of the heat sink 206 by knowing or estimating thermal impedances between the laser emitter 202 and the heat sink 206. In this case, the thermal impedances can describe heat transfer as heat from the laser emitter 202 (and/or other electronic components of the laser) is conducted through the laser emitter 202 itself, across materials and interfaces of the laser, such as through a first interface $INT_1$ to first supporting structure 204(1), through the first supporting structure 204(1), across second interface $INT_2$ to second supporting structure 204(2), through the second supporting structure 204(2), and across third interface $INT_3$, to the heat sink 206.

The number, size, and/or shape of supporting structures 204 and associated interfaces shown in FIG. 2 is not meant to be limiting. A wide variation in the internal structure of the laser 102A is contemplated. Differences in the internal structure can affect an overall thermal impedance between the laser emitter 202 and a point of temperature measurement, such as the heat sink 206 in this case. For instance, the overall laser system thermal impedance can include the effects of heat energy flowing to and/or from nearby electronics through multiple pathways. Stated another way, the overall thermal impedance can include any component or element, electronic or not, that has a significant thermal relationship with the laser emitter. The laser emitter temperature prediction model 110A can utilize the overall thermal impedance of the laser and the case temperature as input to predict the laser emitter temperature. This aspect is described in more detail below relative to FIGS. 5-6. An additional example of an internal laser structure and its overall thermal impedance is provided below relative to FIG. 3 and system 100B.

The predicted laser emitter temperature produced by laser emitter temperature prediction model 110A can be used to compute a compensated electrical current 120A at a pixel by pixel rate if desired and thus any remaining image artifacts can be reduced and/or eliminated. For instance, the compensation and control component 108A can receive the desired optical power 106A for a pixel. The compensation and control component 108A can receive the predicted laser emitter temperature of the laser emitter 202 for the pixel from the laser emitter temperature prediction model 110A. The compensation and control component 108A can utilize the predicted laser emitter temperature to compute the compensated electrical current 120A to drive the laser 102A for the pixel time that illuminates the pixel. The compensated electrical current 120A can cause the actual laser beam optical power to (approximately) match the desired optical power 106A.

Figure 3:
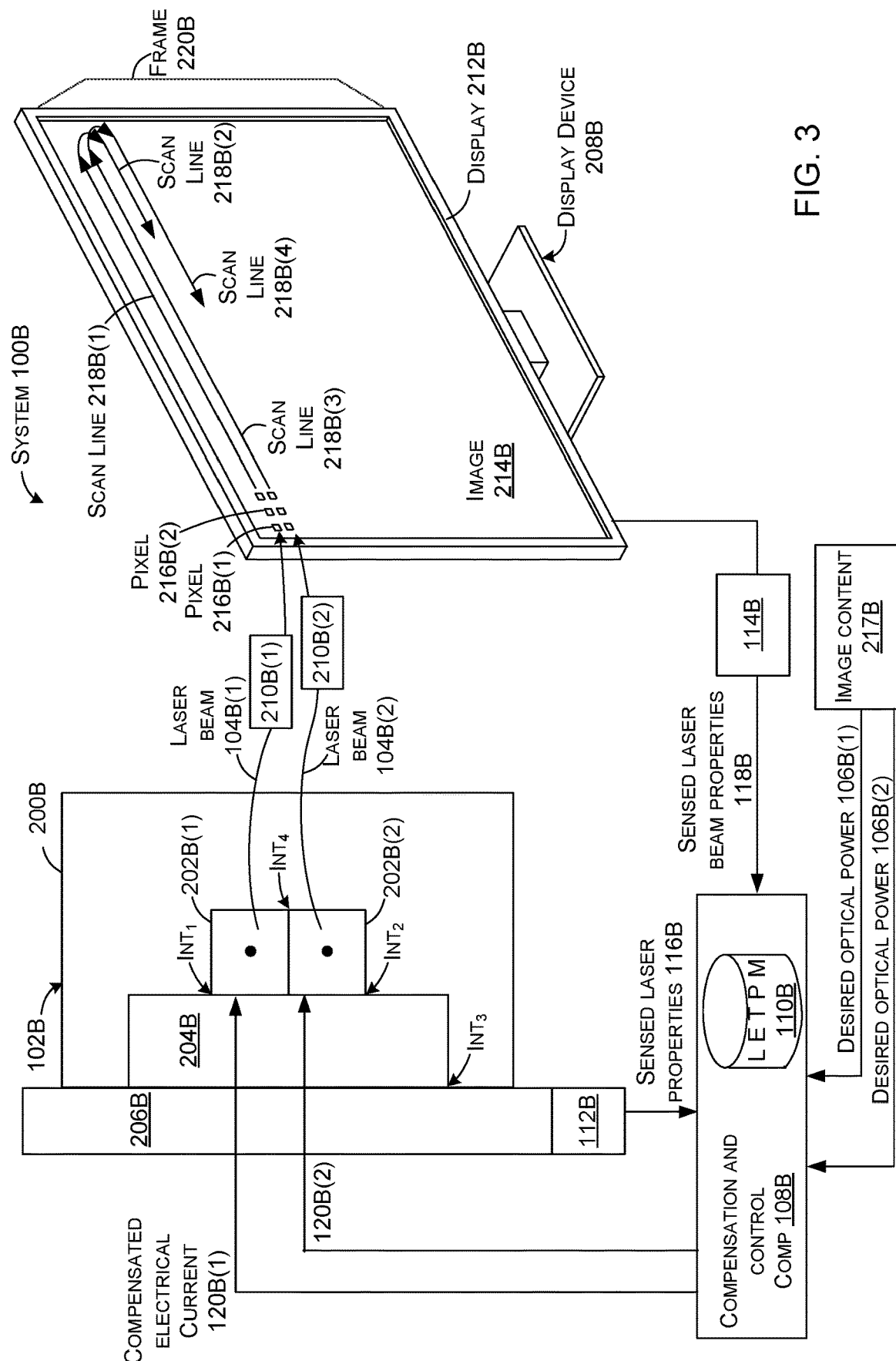

FIG. 3 shows another system 100B that employs multiple laser emitters 202B per laser 102B. As illustrated in FIG. 3, laser 102B is otherwise similar to laser 102A of FIG. 2 and can include a case 200B, multiple laser emitters 202B (in this case two), supporting structures 204B, and a heat sink 206B. Laser beams 104B can be produced by the one or more laser emitters 202B of laser 102B. System 100B can include display device 208B, one or more scanners 210B, compensation and control component 108B, and laser emitter temperature prediction model 110B. Display device 208B can include a display 212B which can display an image 214B. The image 214B can be made up of pixels 216B. Only two pixels 216B(1) and 216B(2) are designated to avoid clutter on the drawing page.

In this example, two laser emitters 202B(1) and 202B(2) are shown, producing two laser beams 104B. By generating an additional laser beam 104B, the two laser emitters 202B can increase the number of scan lines 218B in a single frame 220B. In some cases, the two laser emitters 202B can provide double the density of scan lines 218B, which can produce better image quality. However, using more than one laser emitter 202B can also dramatically increase the complexity of laser emitter temperature prediction. For example, more than one laser emitter 202B can introduce additional variables into the laser emitter temperature prediction problem. For instance, the laser emitters 202B can heat each other, through interface $INT_4$. The laser emitters 202B may also be powered differently over time, such that the amount of additional heat the laser emitters 202B contribute to each other changes over time. The internal structure can affect the overall thermal impedance between the laser emitters 202B and the point of temperature measurement, such as the heat sink 206B. The laser emitter temperature prediction model can reflect this overall thermal impedance to predict the laser emitter temperature. This aspect is described in more detail below relative to FIGS. 5 and 6.

Note that example laser configurations and associated thermal impedances are described above relative to FIGS. 1-3. The overall thermal impedance for a given laser configuration can include any number of laser dies, laser emitters, and/or other electronic components (e.g., heat generating components) associated with the laser. Laser dies (not specifically designated) can include one or more laser emitters per laser die. The thermal impedance can reflect the effects of individual heat generating elements, such as the laser emitters, in isolation and on each other (e.g., effect of a laser emitter on adjacent laser emitter and vice-versa). The details described below relative to FIGS. 5 and 6 can be applied to model thermal impedances of any components or elements that have a thermal relationship with a given laser configuration.

Continuing with the discussion relative to FIG. 3, the compensation and control component 108B can receive the desired optical power 106B and utilize the predicted laser emitter temperature to generate compensated electrical current 120B accordingly. FIGS. 4A-4D offer additional details about the relationships between emitter temperature, electrical current supplied to the laser emitter, and light emitted from the laser emitter.

Figure 4A:
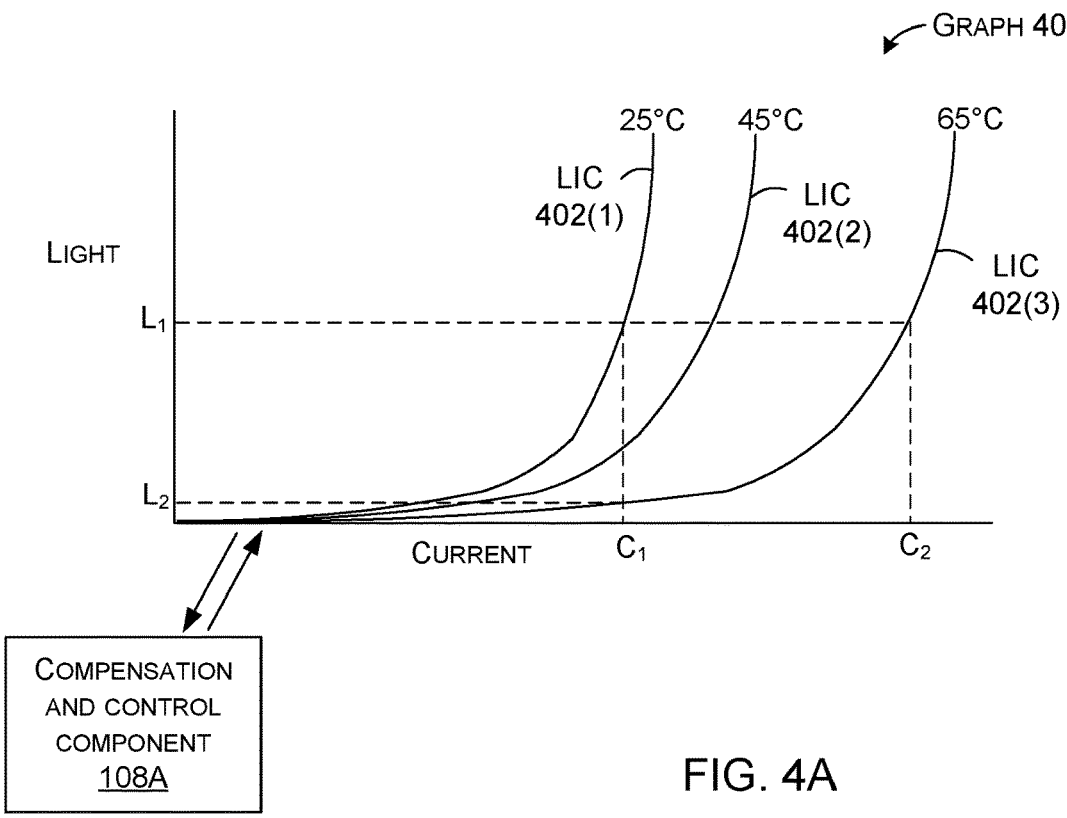
FIGS. 4A and 4B show example current-light-temperature relationships in accordance with some implementations of the present laser control concepts.
Figure 4B:
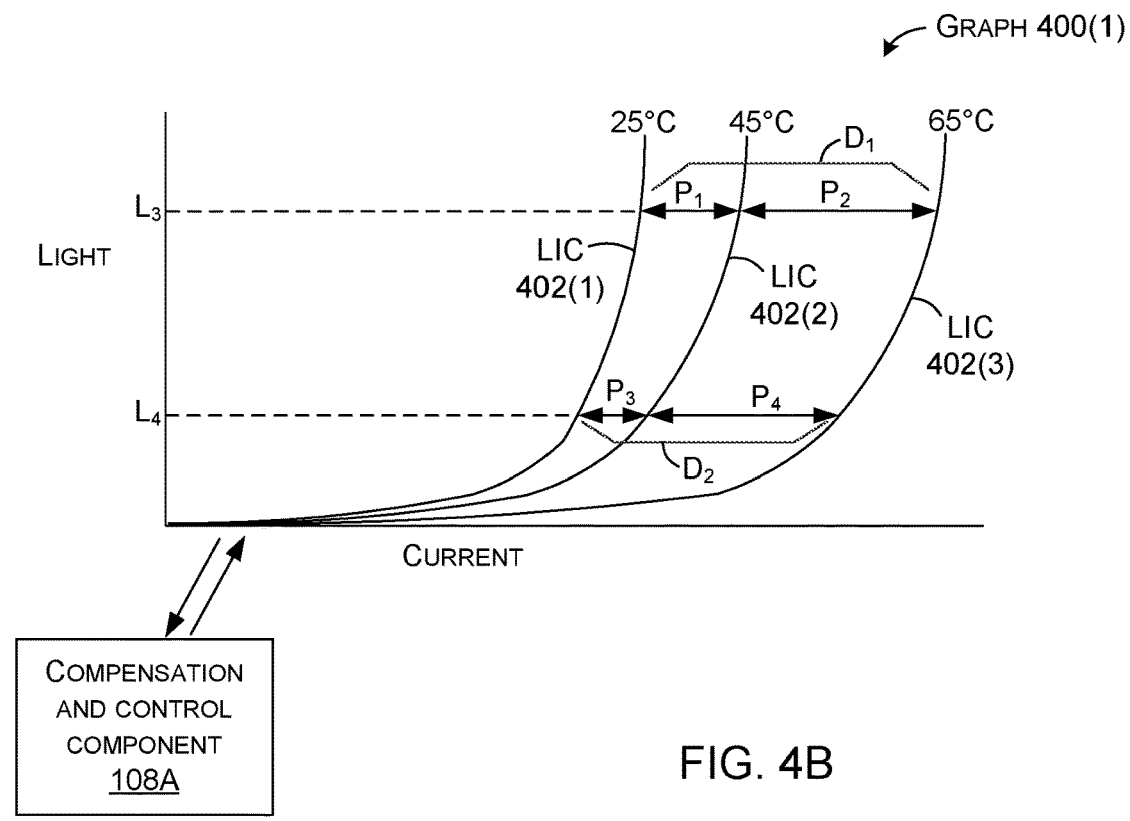

FIGS. 4A and 4B include a graph 400 with example light (e.g., optical power) electrical current (i) curves (LICs) 402. The light-current curves 402 can represent individual light-current-temperature relationships for particular laser emitter temperatures, for example. Graph 400 includes electrical current on the x-axis and light on the y-axis. The light-current curves 402 can relate to particular laser emitter temperatures. In this case, individual light-current curves 402(1), 402(2), and 402(3) are shown for 25° C., 45° C., and 65° C., respectively. Graph 400 is not necessarily drawn to scale. Graph 400 is for illustration purposes and is not meant to be limiting.

In FIG. 4A, a vertical dashed line is drawn on graph 400 at an arbitrary electrical current value, $C_1$ (current can also be represented as 'I'). Horizontal dashed lines are drawn where the electrical current value $C_1$ intersects light-current curves 402(1) and 402(3), corresponding to optical power values $L_1$ and $L_2$. As shown in FIG. 4A, a laser emitter temperature increase from 25° C. to 65° C. can cause a significant decrease in resultant optical power for the same electrical current input to the laser emitter, from $L_1$ down to $L_2$. Therefore, laser emitter temperature can significantly affect laser emitter efficiency. FIG. 4A also includes a vertical dashed line at electrical current value $C_2$. In an instance where $L_1$ is a desired optical power value for a particular pixel of a displayed image, and a laser emitter temperature of the laser is 65° C., the laser emitter would have to be driven with an electrical current value of $C_2$ in order to produce the desired optical power value. In this instance, driving the laser with $C_1$ (which corresponded to 25° C.) would not maintain a desired optical power. The compensation and control component 108 can utilize the LI curves to compensate or adjust electrical current to reflect the predicted laser emitter temperature. However, it is unlikely that an LI curve is available for the predicted emitter temperature for an individual interval (e.g., the predicted emitter temperature may not exactly match the temperature of any of the known LI curves). The discussion below relative to FIG. 4B explains how to determine an electrical current for a predicted emitter temperature that does not correspond to an available LI curve.

FIG. 4B illustrates additional aspects of light-current (LI) curves 402. The LI curves can reflect known values at specific temperatures (e.g., in this case, 25, 45, and 65 degrees). Values for other temperature can be interpolated from the known LI curves. On the graph 400(1) shown in FIG. 4B, at an optical power value of $L_3$, light-current curve 402(1) can be a distance $D_1$ from light-current curve 402(3). Light-current curve 402(2) can be a percentage $P_1$ of the distance $D_1$ from light-current curve 402(1), and can be a percentage $P_2$ of the distance $D_1$ from light-current curve 402(3). Similarly, at optical power value $L_4$, light-current curve 402(1) can be a distance $D_2$ from light-current curve 402(3), light-current curve 402(2) can be a percentage $P_3$ of the distance $D_2$ from light-current curve 402(1), and light-current curve 402(2) can be a percentage $P_4$ of the distance $D_2$ from light-current curve 402(3). In some cases, although 45° C. is half-way between 25° C. and 65° C., the light-current curves corresponding to these laser emitter temperatures may not be evenly spaced. For example, as depicted in FIG. 4B, percentage $P_1$ of distance $D_1$ is relatively less than percentage $P_2$ of distance $D_1$. This is one example of a non-linear aspect that can be inherent to the light-current curves 402. Another example can be differences between the percentages at different optical power values. In this example, percentage $P_1$ of distance $D_1$ can be different than percentage $P_3$ of distance $D_2$. Stated another way, the location of light-current curve 402(2) between light-current curve 402(1) and light-current curve 402(3) can change with optical power. An example of this relationship for a particular laser configuration is shown in FIG. 4C.

Figure 4C:
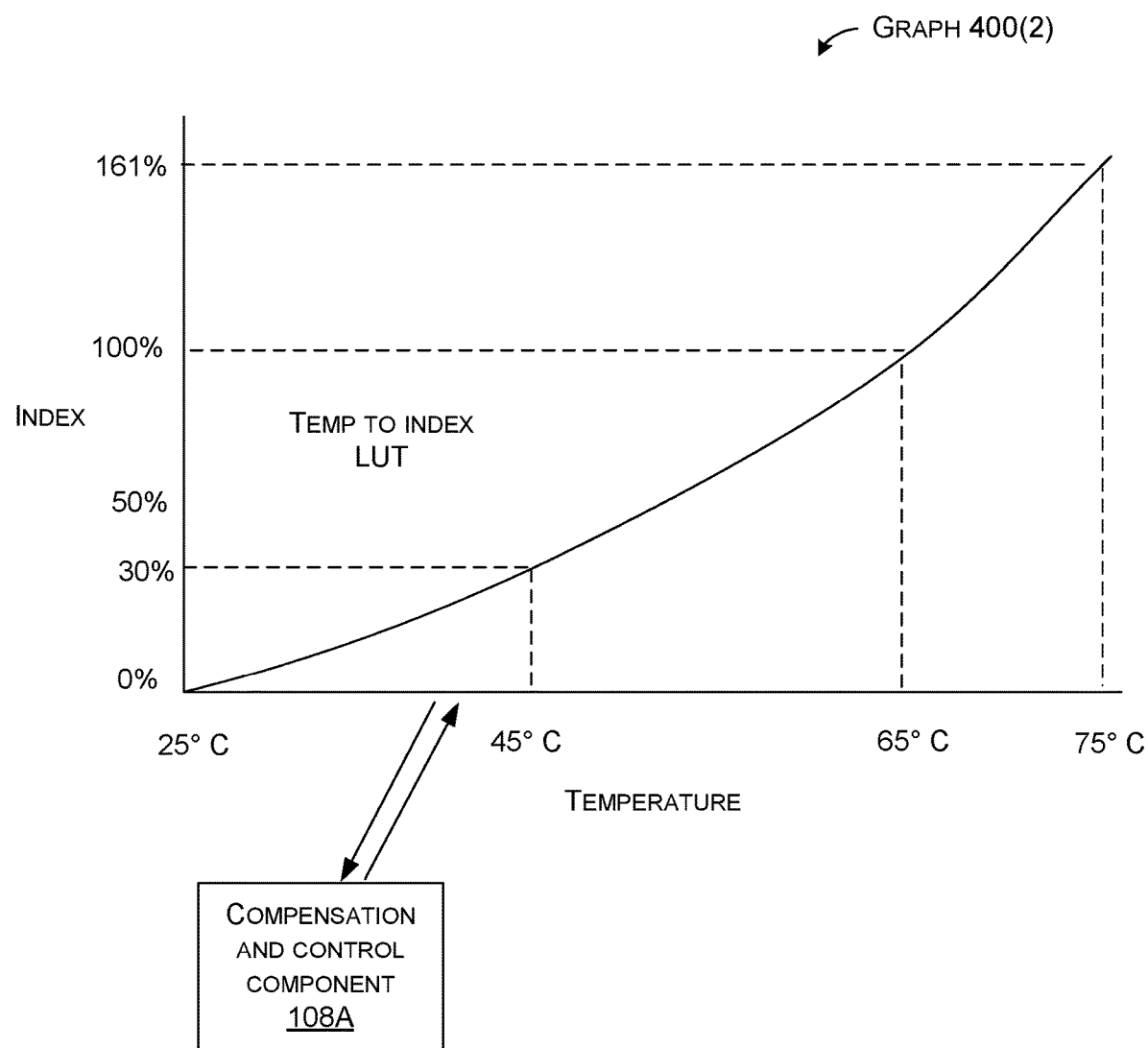
FIG. 4C shows example temperature-optical power relationships in accordance with some implementations of the present laser control concepts.

FIG. 4C shows a graphical representation of a temperature to index transfer function as graph 400(2). This graph can function as a temperature to index LUT that reflects relationships between optical power or light (vertical axis) and temperature (horizontal axis) as mentioned above.

Figure 4D:
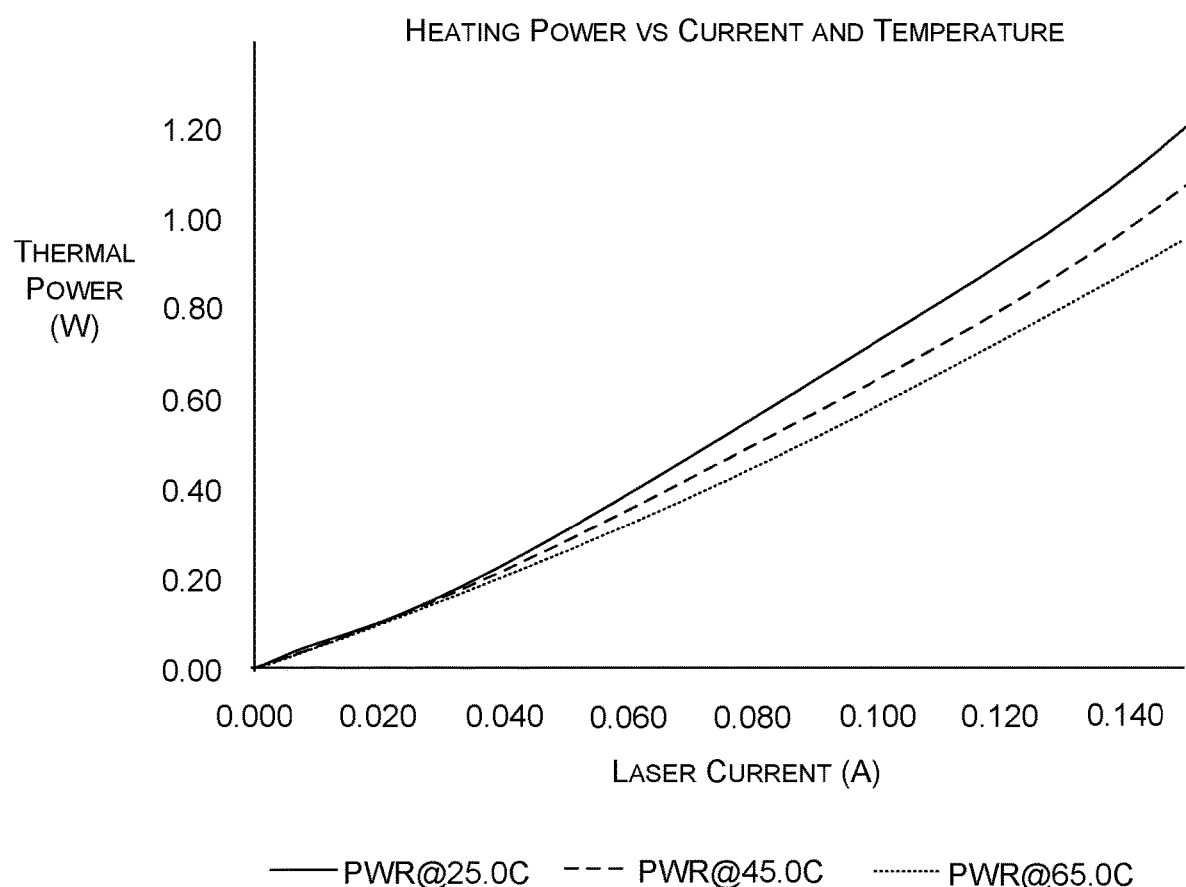
FIG. 4D shows example heating power versus current and temperature relationships in accordance with some implementations of the present laser control concepts.

FIG. 4D shows a graphical representation of a thermal or heating power versus current and temperature function as graph 400(3). This graph can represent code to power relationships (e.g., the thermal power that must have been applied to the laser emitter given some combination of the compensated electrical current, the temperature information, and the optical output). Note that the example graphs of FIGS. 4A-4D can relate to one example laser configuration (e.g., one laser model). Similar graphs can be constructed for other laser configurations. In this implementation, the compensation and control component 108A can solve the technical problems of maintaining desired optical power of the laser by utilizing the predicted laser emitter temperature provided by the laser emitter temperature prediction model. The compensation and control component 108A can compute the compensated electrical current for the laser in a manner that reflects the sensitivity of laser efficiency to emitter temperature for a given optical power. This aspect is discussed in more detail below relative to FIG. 5.

Figure 5:
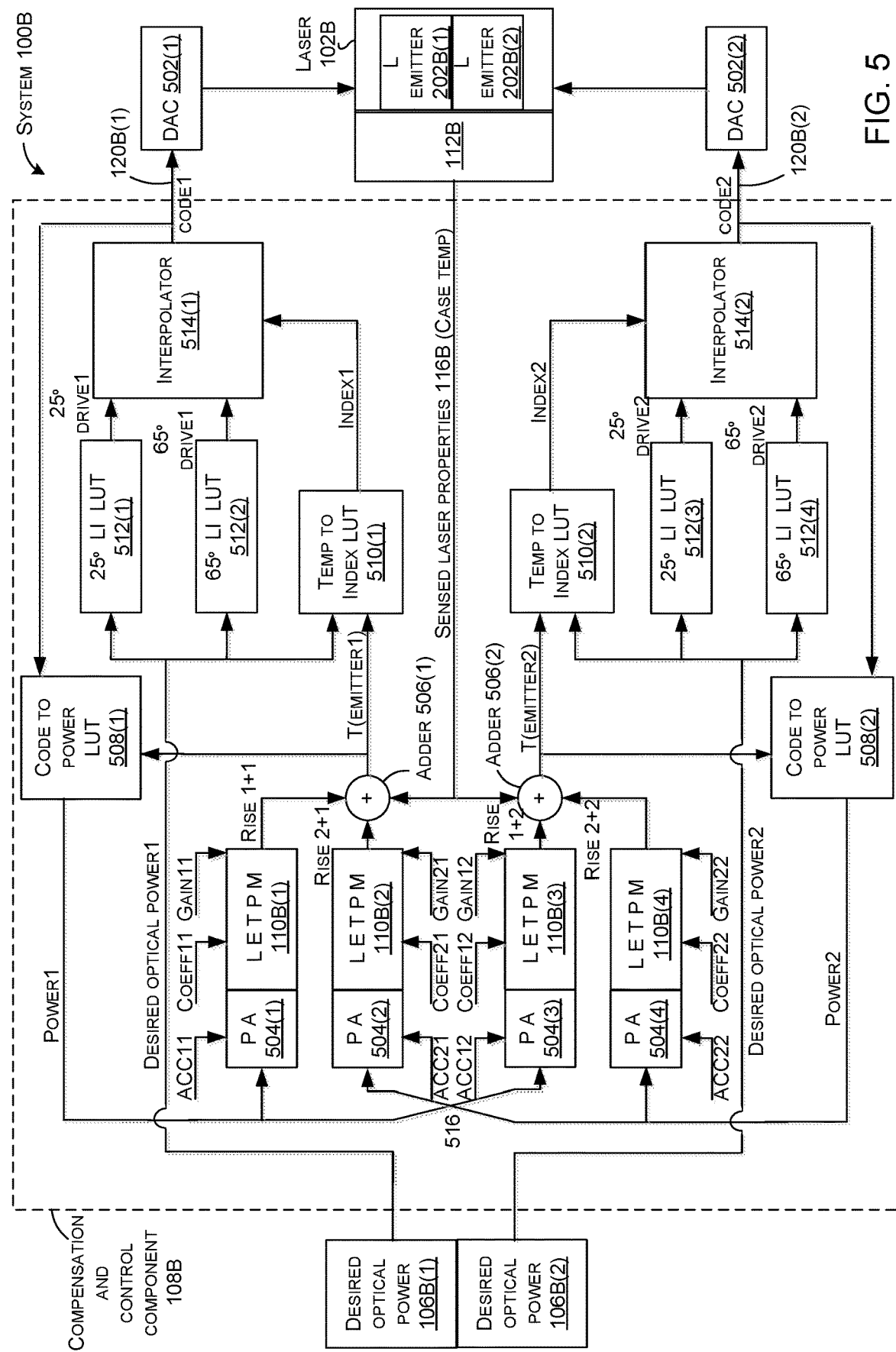

FIG. 5 provides a schematic of components that can implement system 100B, which was introduced relative to FIG. 3. Recall that in system 100B, laser 102B includes two laser emitters 202B(1) and 202B(2). Consistent with FIG. 3, the compensation and control component 108B in FIG. 5 receives the desired optical powers 106B(1) and 106B(2) on the left side of the page. For each pixel, the compensation and control component 108B ultimately computes a compensated electrical current 120B(1) and 120B(2) on the right side of the page. Because there are two laser emitters 202B(1) and 202B(2), the compensation and control component 108B produces two compensated electrical currents 120B (e.g., compensated electrical current 120B(1) on the top of the page for laser emitter 202B(1) and compensated electrical current 120B(2) on the bottom of the page for laser emitter 202B(2)). Because there are two laser emitters 202B, the circuitry is in large part duplicated so that the top half of the FIG. relates to laser emitter 202B(1) and the bottom half of the FIG. relates to laser emitter 202B(2). The discussion that follows will emphasize the top half of the FIG. with the recognition that the bottom half is similar and that if additional laser emitters were employed then additional sets of circuitry could be employed, etc. Where possible, the top half of the FIG. that relates to laser emitter 202B(1) is referred to with a '1' and the bottom half that relates to laser emitter 202B(2) is referred to with a '2.'

The compensated electrical current 120B can be manifest as a digital code (code1) that is fed to a digital to analog converter (DAC) 502 (e.g., DAC 502(1) on the top of the page connected to laser emitter 202B(1) and code2 to DAC 502(2) on the bottom of the page connected to laser emitter 202B(2)). The DAC converts the digital code to an analog electrical current that is used to cause the laser emitter 202B(1) to emit the laser beam (104B(1), FIG. 3).

The remainder of the components relate to the compensation and control component 108B. Starting on the left side of the page and vertically arranged, the compensation and control component can include power accumulators 504, laser emitter temperature prediction models 110B, adders 506, code to power LUTS 508, temperature to index LUTs 510, LI LUTs 512, and/or interpolators 514. An LI LUT can be a look up table populated with data from a light to current curve (LIC) relating to a specific laser emitter temperature (in this example 25 degrees and 65 degrees) or other computing mechanism. LICs are explained above relative to FIGS. 4A and 4B. While not specifically illustrated, a pixel clock can be employed to synchronize the function of various components.

For purposes of explanation, beginning at interpolator 514(1), assume that the interpolator has generated the compensated electrical current 120B (e.g., code1), which is fed back to code to power LUT 508(1) which optionally receives predicted laser emitter temperature (T(emitter1)) from adder 506(1) (described below). Recall that the code produced by the interpolator 514(1) commands an analog electrical current produced by the DAC 502(1). The code to power LUT 508(1) can infer the thermal power that must have been applied to the laser 102B given some combination of the compensated electrical current, the temperature information, and the optical output power (which can also be estimated). An example graphical representation of such a code to power LUT 508(1) is represented in graph 400(3) of FIG. 4D.

The thermal power value (e.g., power1) determined by the code to power LUT 508(1) can be fed back to the power accumulator 504(1). (Note also that while the discussion is focusing on the top half of the FIG. relating to laser emitter 202B(1), the thermal power can be fed back in a cross-over manner indicated at 516, so that the top half of the circuitry receives power information about the thermally related laser emitter shown in the bottom half (e.g., power2 and vice-versa). The power accumulator 504(1) can optionally accumulate values representing the thermal energy associated with multiple previous pixels prior to entering the laser emitter temperature prediction model 110B. Accumulating the thermal energy reduces the complexity of the laser emitter temperature prediction model 110B but also adds delay to the predicted temperature output (e.g., T(emitter1)). The power accumulator 504 is useful for long temperature time constants that might otherwise require increased complexity in the temperature prediction model 110B.

The laser emitter temperature prediction model 110B(1) can predict a temperature of the laser emitter 202B(1) by modeling thermal characteristics of the laser 102B as a model of time and thermal power. The thermal power can be the difference between the electrical power for the interval (and previous intervals) and the optical power emitted by the laser emitter for the interval (and previous intervals) (e.g., any electrical power that was not converted to optical power was converted to thermal power (e.g., heat)). This aspect is described in more detail below relative to FIG. 6. The temperature rise can be delivered to adder 506. The adder also receives the temperature rise relating to laser emitter 202B(2) from laser emitter temperature prediction model 110B(2) and sensed laser properties 116B (e.g., case temperature) from laser sensor 112B.

In this case, the laser sensor 112B can be manifest as a thermistor positioned on the laser's case and the sensed laser properties 116B can be manifest as a case temperature of the laser 102B. The adder 506(1) can send the sum of this thermal data (e.g., T(emitter1)) to the temperature to index LUT 510(1). Some implementations can provide additional refinement by supplying the thermal data (e.g., T(emitter1)) to the code to power LUT 508(1) so that emitter temperature can be considered in the code to power function. Alternatively or additionally, the desired optical power1 can be supplied to the temperature to index LUT 510(1) to allow for further refinement in the computation. This aspect was described above relative to FIG. 4C.

The desired optical power1 is supplied to the LI LUTs 512. Recall that any plural number of LI LUTs can be employed. In one case, light-current curve LUTs 512(1) and 512(3) can correspond to a 25° C. light-current curve, while LI LUTs 512(2) and 512(4) can correspond to a 65° C. light-current curve, for example. In some cases, LI LUTs 512(1) and 512(3) can actually be the same LI LUT accessed by both interpolators 514(1) and 514(2), for example.

Output from the LI LUTS 512 and the temperature to index LUTs 510 can be provided to or accessed by the interpolator 514. As mentioned above, it is possible that the predicted laser emitter temperature matches one of the temperatures of the LI LUTs 512. For instance, the predicted laser emitter temperature could be 65 degrees and one of the LI LUTs could relate light (e.g., optical power) to electrical current at 65 degrees. Thus, interpolator 514 can compute the compensated electrical current directly from the LI LUT. More likely though, the predicted laser temperature will not be an exact match. In such a case, the interpolator can interpolate or extrapolate from the available values of the LI LUTs to the predicted laser emitter temperature. Recall from the discussion above this tends to not be a linear function. The temperature to index LUT 510(1) can provide the relationship between the available values. For instance, the predicted laser emitter temperature may be 45 degrees. The temperature to index LUT 510(1) could indicate that percentage-wise, the values of the 45 degree LIC curve are 30% from 25 degrees and 70% from 65 degrees. Thus, the interpolator 514 can compute the compensated electrical current as 30% of (value of $LI_{65°}$–value of $LI_{25°}$)+value of $LI_{25°}$ by interpolating between the values of the two LI LUTs.

In still another scenario, the predicted laser emitter temperature may lie outside the available LI LUTs 512. For instance, continuing with the above example, the predicted laser emitter temperature may be 75 degrees and the LI LUTs can relate to 25 degrees and 65 degrees. The temperature to index LUT 510 can provide percentage-wise increases beyond the available LI LUTs. For instance, the relationships of the temperature to index LUT may indicate that there will be an additional 61% current jump from 65 degrees to 75 degrees. This would be reflected as a value of 161% on the Index axis of graph 400(2) (FIG. 4C) at the 75-degree point on the temperature axis. As such, the interpolator 514 can extrapolate the compensated electrical current for the desired optical power as 161% of (value of LI65°–value of LI25°)+value of LI25°. In each of the above scenarios, the interpolator 514 can send compensated electrical current information 120B (code1) to digital-to-analog converter (DAC) 502, which can drive the laser 102B (e.g., laser emitter 202B(1)).

Figure 6:
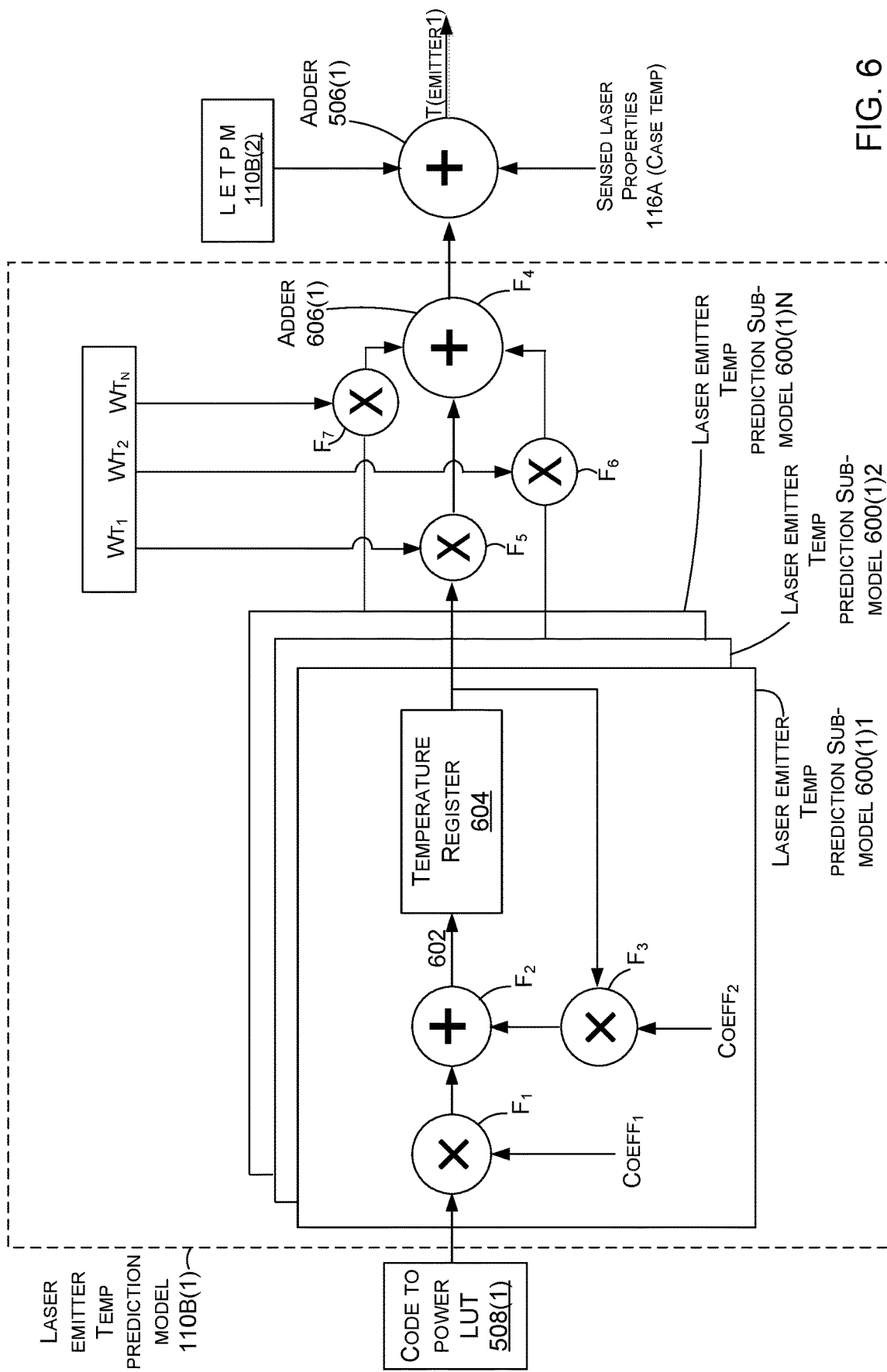
FIG. 6 shows additional details about some of the elements shown in FIG. 5 in accordance with some implementations of the present laser control concepts.

FIG. 6 provides additional detail relating to laser emitter temperature prediction models 110B(1), 110B(2), 110B(3), 110B(4) shown in FIG. 5. Among other configurations, each of those laser emitter temperature prediction models 110B can be implemented as a multitude of recursive (sometimes called infinite impulse response, 'IIR') filter sub-models 600(1)1, 600(1)2, . . . 600(1)N, each of which receives as input the thermal power (e.g. power1, FIG. 5) applied to the laser and predicts a portion of the emitter temperature rise above the laser case temperature as a function of time. The laser emitter temperature prediction models 110B can run continuously so the temperature prediction is always up-to-date. Recall from FIG. 5 that in this implementation the laser emitter prediction model 110B(1) receives the power1 input from the code to power LUT 508 and sends its output to adder 506(1) as Rise 1+1. Also, the power accumulator 504(1) is discussed above relative to FIG. 5, but is not shown here. These aspects are not revisited here for sake of brevity.

In this case, the laser emitter temperature prediction model 110B(1) in FIG. 5 can employ multiple recursive filter elements referred to as laser emitter temperature prediction sub-models 600(1)1-600(1)N in FIG. 6 to model the effects of thermal impedances, such as a thermal interface or material of the laser. Examples of materials and interfaces are discussed and designated relative to FIGS. 2 and 3. Stated another way, because the laser can include multiple materials and interfaces that contribute to the overall thermal impedance, multiple laser emitter temperature prediction sub-models may be employed. As each output of these laser emitter temperature prediction sub-models 600 can predict a portion of the total temperature rise, all of the outputs can be added together with appropriate weighting factors to predict the total temperature rise (e.g., Rise 1+1).

Continuing with FIG. 6, in this example individual laser emitter temperature prediction sub-models (e.g., 600(1)1, etc.) can include multiplication functions $F_1$ and $F_3$, an addition function $F_2$, coefficients $COEFF_1$ and $COEFF_2$, and a temperature register 604. Together, as is known to those skilled in the art, they can be used to create a recursive, single-pole, low-pass filter that has a decaying exponential time response. The decay time of each filter can be chosen to mimic one of the thermal time constants of the laser thermal impedance. As described above, the thermal impedances in systems 100A and 100B can include many thermal time constants and each has an impact on the overall temperature versus power relationship in varying proportions. In the example shown in FIG. 6, the proportional contributions of up to "N" sub-models' time constants can be matched to the individual time constant contributions making up the thermal impedance of an actual laser system (e.g., 100A) by using function blocks $F_5$, $F_6$, and $F_7$ to multiply the output of each sub-model by weighting factors $WT_1$, $WT_2$, and $W_{TN}$ before adding them all together using function $F_4$ (i.e., Adder 606(1)).

Those skilled in the art know that other arrangements of multiplication functions, addition functions, coefficients, and/or a temperature register can be used to create recursive, single-pole, low-pass filters that have the same decaying exponential time responses. Such alternate arrangements may utilize different numbers of multiplication and addition functions as well as different numbers of coefficients. In other arrangements, the weighting factors can be applied at the inputs to the laser emitter temperature prediction sub-models 600 or incorporated into the coefficient values. In yet other arrangements, the multiple single-pole filters could be replaced by one or more multi-pole filters. The particular functions shown in FIG. 6 are not meant to be limiting.

In this example, for each filter comprising a specific laser emitter temperature prediction sub-model 600, the new output is determined by combining a new input value (e.g., power1) and the previous filter output value with weighting factors $COEFF_1$ and $COEFF_2$ determining how much each contributes to the new output value. Temperature register 604 retains the immediately previous output value to allow this computation. Looking back in time, the previous output value was also a weighted combination of its input and even earlier output values, so the sub-model output reflects the complete history of its input and output values. This means that the output value of any individual filter will follow the input, but only slowly, since the "inertia" of the filter's previous output values must be "overcome" by new inputs.

When multiple filter (i.e., laser emitter temperature prediction sub-model) outputs are summed together, the overall response will remain slow though any individual filter may respond faster or slower than the others in the combination. This type of behavior matches the general thermal response of laser systems 100A and 100B to any thermal power inputs. The specific thermal behavior of laser systems 100A and 100B can be matched to a desired level of accuracy by choosing appropriate time constants for the filters (e.g., laser emitter temperature prediction sub-models 600(1)1 to 600(1)N relating to laser emitter temperature prediction model 110B(1) and similar laser emitter temperature prediction sub-models (not shown) relating to the other laser emitter temperature prediction models) and choosing appropriate weighting factors ($WT_1$, $WT_2$, . . . $W_{TN}$) specific to each filter. Summing all the weighted outputs in adder 606(1) generates the overall thermal prediction model value (the output value of 110B(1), 110B(2), etc.).

Stated another way, the temperature rise of the laser emitter above the laser case temperature may change gradually when driven with a new level of thermal power. The laser emitter may eventually reach a thermal equilibrium for a constant thermal power level, but it is more likely that the laser emitter will be driven with a newer thermal power level yet again before thermal equilibrium is reached. In similar fashion, the emitter temperature rise predicted by each laser emitter thermal prediction model 110B will depend upon the starting laser emitter temperature and will change as the applied thermal power changes. Eventually, the laser emitter temperature prediction model will also reach an equilibrium value for a constant thermal power level but if a new thermal power level appears at the input to the laser emitter temperature prediction model, it will predict a new temperature. In this way, the laser emitter temperature prediction model is constantly updating its temperature rise prediction based on applied thermal power.

The output of laser emitter temperature prediction model 110B(1) (i.e., output of adder 606(1)) can be sent to adder 506(1). Note that FIG. 6 elaborates on laser emitter temperature prediction model 110B(1) but is applicable to the other laser emitter temperature prediction models 110B(2)-110B(4). Laser emitter temperature prediction model 110B(1) captures the thermal effect of thermal power applied to laser emitter 202B(1) on itself (FIG. 5). Laser emitter temperature prediction model 110B(2) captures the thermal effect of thermal power applied to laser emitter 202B(2) on laser emitter 202B(1). As discussed relative to FIG. 5, adder 506(1) receives input values from laser emitter temperature prediction models 110B(1) and 110B(2) and the laser case temperature and outputs the temperature (i.e., T(emitter1)) of laser emitter 202B(1).

Looking at FIGS. 5 and 6 collectively, some of the implementations described above can be distinguished from traditional systems where the light data is input to a single LI LUT that outputs a DAC code to drive the laser current to produce the desired optical power. In such a traditional system, the LI LUT data are collected as a part of system calibration. The measured light is compared to the expected light for each frame and the LI LUT is repopulated. A simple algorithm is used to stretch and scale the LI LUT data as the feedback mechanism to align the measured light with the expected light for the next frame. This approach does not compensate for the wild temperature fluctuations that can occur within a frame time and often results in large deltas between the actual or emitted optical power and the desired optical power.

The present concepts can employ a second (or more) LI LUT (512, FIG. 5) containing light to current data collected at different temperatures (e.g. 65 and 25 degrees). The LI LUTs 512 feed interpolator 514 which can interpolate between the two LI LUTs according to an index value provided by temperature to index LUT 510. (As a result, no stretching or scaling or repopulation of either LI LUTs is required.) This multiple LI LUT and interpolator arrangement can form a virtual LUT (e.g., two or more LUTs for specific temperatures and the interpolator that can identify the compensated electrical current for any desired optical output as a function of any temperature). The interpolator feeds the laser DAC 502 as described above. The index value can be a simple function of the predicted laser emitter temperature or it could be a more complicated function of predicted laser emitter temperature as defined by the Temp-to-Index LUT 510. Temperature prediction is based on the laser emitter temperature prediction model of the laser, which can be implemented by the compensation and control component 108.

In some implementations, the laser emitter temperature prediction models can be based on one or more infinite impulse response (IIR) low pass filters (e.g., laser emitter temperature prediction sub-models) that accept a representation of laser power as its input, apply a system-dependent gain to this laser power, and output a value representing temperature rise. This temperature rise can be added to the known case temperature to predict a laser emitter temperature for any instant in time regardless of how dynamic the temperature rise is. The case temperature could be provided by a simple thermistor since this temperature tends to change slowly. In another implementation, the case temperature could be inferred by use of an integration feedback system in which measured light is compared to expected light. When the measured light is less than expected, the inferred case temperature can be increased—and vice versa.

Several implementations are contemplated including alternatives for determining case temperature to those mentioned above. Various laser emitter temperature prediction models that model thermal characteristics of the laser can be employed. Some of these implementations employ IIR filters. A potentially important point for some IIR implementations is that the emitter temperature prediction IIR filter may include several IIR filter stages, each representing the various thermal impedances that may exist between the laser emitter and the laser case. Also, the virtual LI LUT may be comprised of more than 2 physical LUTs (e.g., 3 or 4). The interpolator may extrapolate for temperatures outside the range covered by the physical LUTs. The temperature-to-index LUT may benefit from including optical power as an input to enhance accuracy and/or to provide feedback to check the accuracy of the compensation and control component.

Figure 7:
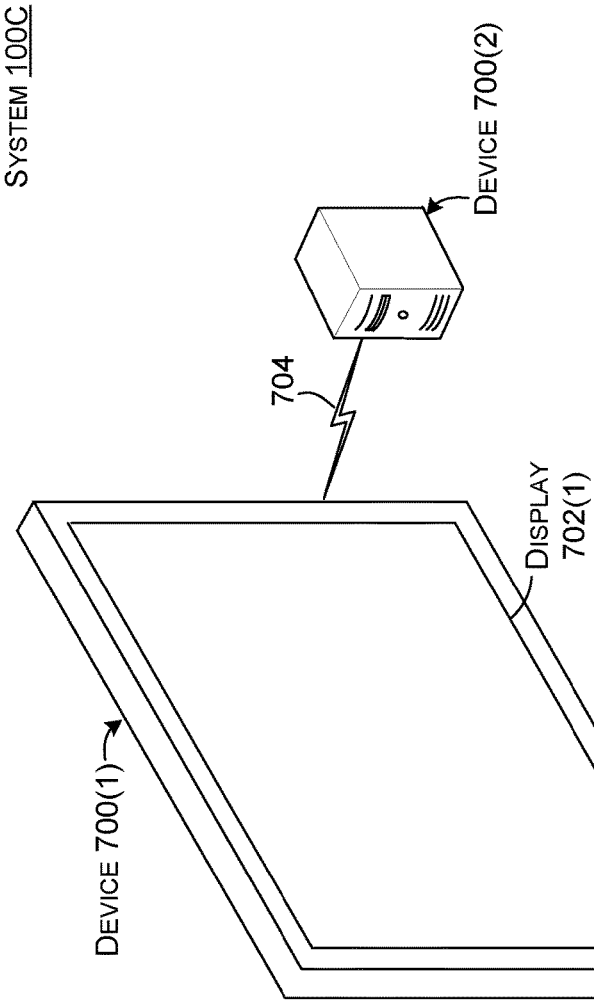
Figure 7:
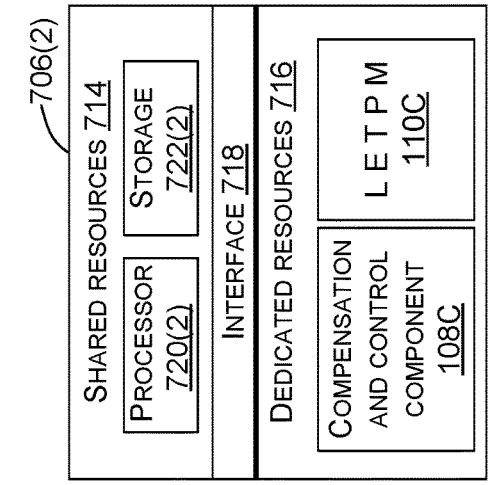

FIG. 7 illustrates an example system 100C that shows various device implementations. Devices 700 can be similar to display devices 208 and/or 208B, described above relative to FIGS. 2 and 3. In this case, three device implementations are illustrated. Device 700(1) can operate cooperatively with device 700(2). Device 700(1) can be manifest as a display device for a personal computer, a television, or a projection display device, for example. Device 700(3) is manifest as a head-mounted display device. Individual devices can include a display 702, which can be similar to display 212 and/or 212B. Devices 700 can communicate over one or more networks, such as network 704. While specific device examples are illustrated for purposes of explanation, devices can be manifest in any of a myriad of ever-evolving or yet to be developed types of devices.

Individual devices 700 can be manifest as one of two illustrated configurations 706(1) and 706(2), among others.

Briefly, configuration 706(1) represents an operating system centric configuration and configuration 706(2) represents a system on a chip configuration. Configuration 706(1) is organized into one or more applications 708, operating system 710, and hardware 712. Configuration 706(2) is organized into shared resources 714, dedicated resources 716, and an interface 718 there between.

In either configuration, the devices 700 can include a processor 720, storage 722, a compensation and control component 108C, and/or a laser emitter temperature prediction model 110C. Individual devices can alternatively or additionally include other elements, which are not illustrated or discussed here for sake of brevity.

Devices 700(1) and 700(2) can be thought of as operating cooperatively to perform the present concepts. For example, device 700(2) may include an instance of processor 720, storage 722, compensation and control component 108C, and/or a laser emitter temperature prediction model 110C. In this example, the device 700(2) can receive sensed laser properties and/or sensed laser beam properties from device 700(1), and send a compensated electrical current to device 700(1). In contrast, devices 700(1) and/or 700(3) may be self-contained devices that include both an instance of the display 702, processor 720, storage 722, compensation and control component 108C, and laser emitter temperature prediction model 110C.

In some implementations, a device such as device 700(3) could include a SoC configuration, such as an application specific integrated circuit (ASIC) that includes compensation and control component 108C and laser emitter temperature prediction model 110C. Other device implementations, such as head-mounted display device 700(3) can include a processor, such as CPU and/or GPU, that renders frames and can also execute compensation and control component 108C and laser emitter temperature prediction model 110C, on the same processor or on another processor.

From one perspective, any of devices 700 can be thought of as computers. The term "device," "computer," or "computing device" as used herein can mean any type of device that has some amount of processing capability and/or storage capability. Processing capability can be provided by one or more processors that can execute data in the form of computer-readable instructions to provide a functionality. Data, such as computer-readable instructions and/or user-related data, can be stored on storage, such as storage that can be internal or external to the computer. The storage can include any one or more of volatile or non-volatile memory, hard drives, flash storage devices, optical storage devices (e.g., CDs, DVDs etc.), and/or remote storage (e.g., cloud-based storage), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and/or flash memory, among others.

As mentioned above, configuration 706(2) can be thought of as a system on a chip (SOC) type design. In such a case, functionality provided by the device 700 can be integrated on a single SOC or multiple coupled SOCs. One or more processors can be configured to coordinate with shared resources 714, such as memory, storage, etc., and/or one or more dedicated resources 716, such as hardware blocks configured to perform certain specific functionality. Thus, the term "processor" as used herein can also refer to central processing units (CPUs), graphical processing units (GPUs), field programmable gate arrays (FPGAs), controllers, microcontrollers, processor cores, or other types of processing devices. The compensation and control component 108C and laser emitter temperature prediction model 110C can be manifest as dedicated resources 716 and/or as shared resources 714.

Generally, any of the functions described herein can be implemented using software, firmware, hardware (e.g., fixed-logic circuitry), or a combination of these implementations. The term "component" as used herein generally represents software, firmware, hardware, whole devices or networks, or a combination thereof. In the case of a software implementation, for instance, these may represent program code that performs specified tasks when executed on a processor (e.g., CPU or CPUs). The program code can be stored in one or more computer-readable memory devices, such as computer-readable storage media. The features and techniques of the component are platform-independent, meaning that they may be implemented on a variety of commercial computing platforms having a variety of processing configurations.

Figure 8:
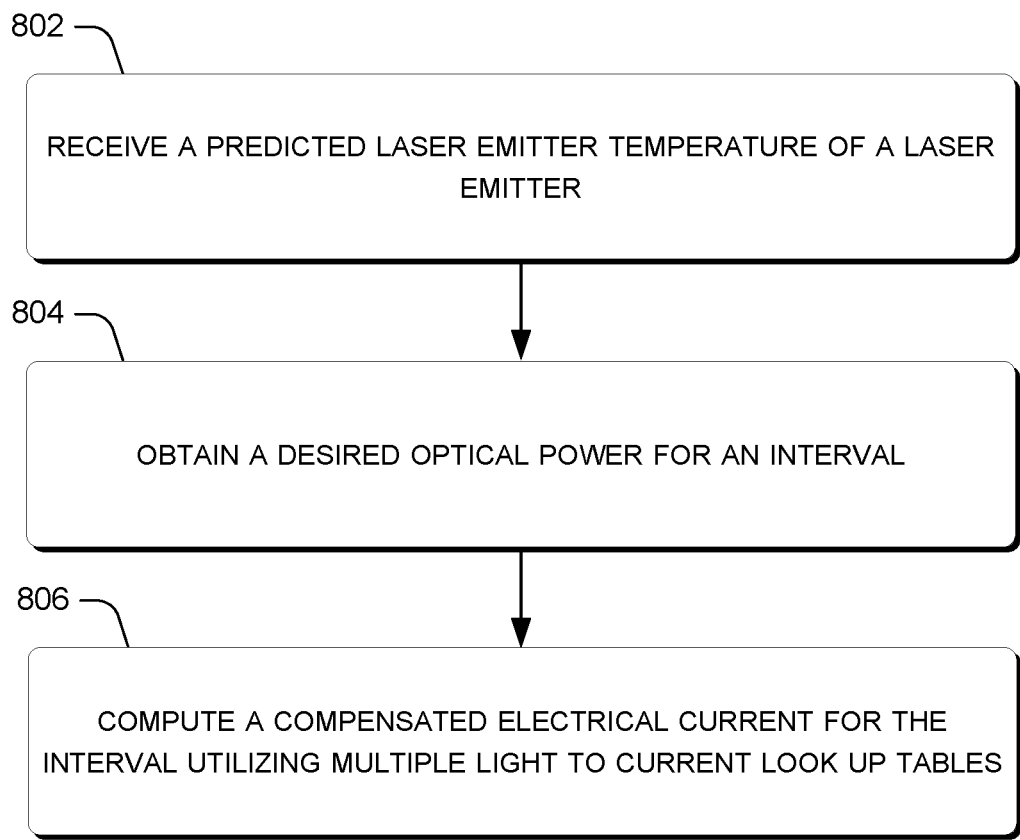
FIGS. 8 and 9 show example laser control flowcharts in accordance with some implementations of the present laser control concepts.

FIG. 8 shows an example laser control method 800.

In this case, block 802 can receive a predicted laser emitter temperature of a laser emitter.

Block 804 can obtain a desired optical power for an interval (e.g., pixel time).

Block 806 can compute a compensated electrical current for the interval utilizing multiple light to current look up tables. Individual light to current look up tables can relate to specific laser emitter temperatures.

Figure 9:
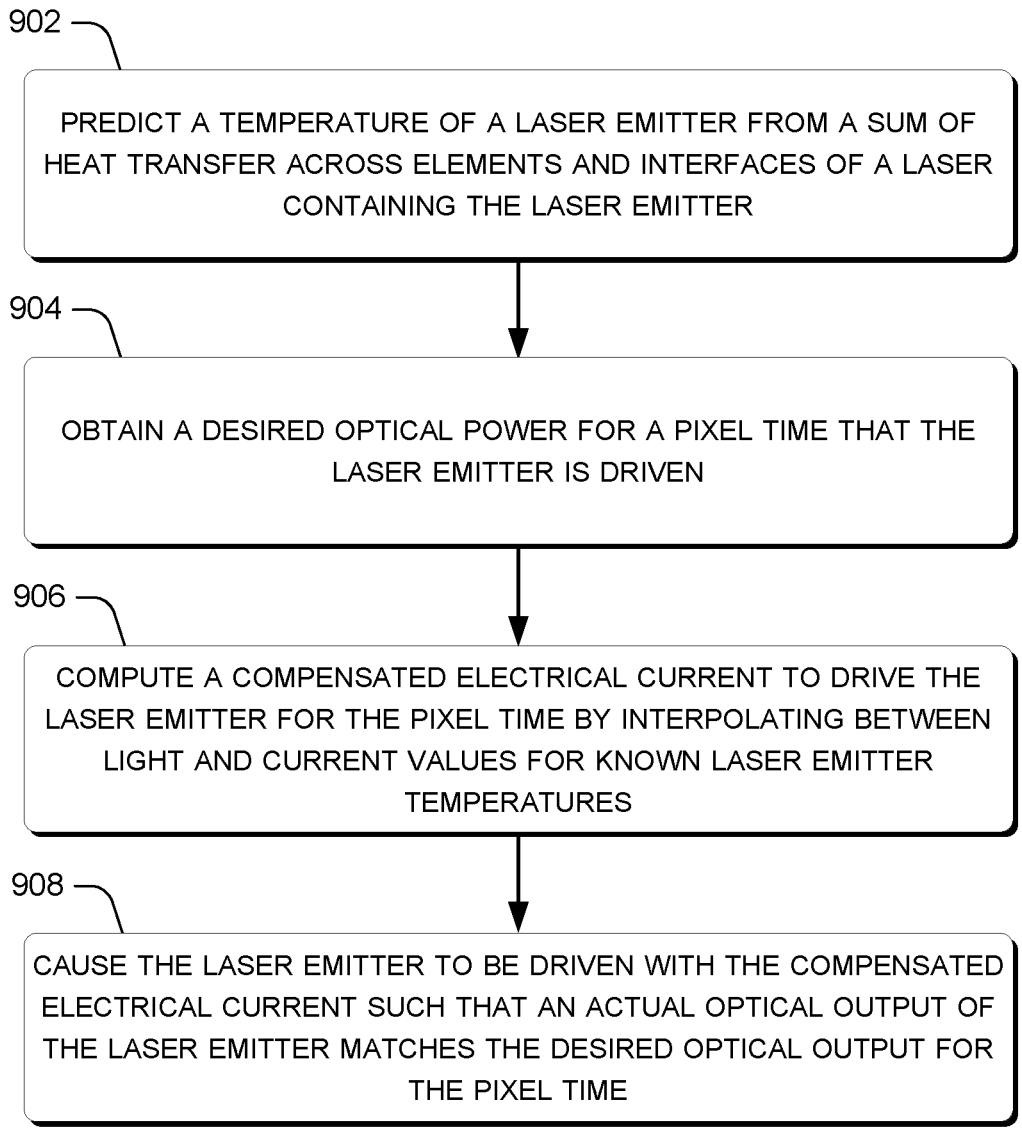

FIG. 9 shows an example laser control method 900.

In this case, block 902 can predict a temperature of a laser emitter from a sum of heat transfer across elements and interfaces of a laser containing the laser emitter. The predicted temperature of the laser emitter can be accurate for a laser that employs a single laser emitter and/or a laser that employs multiple laser emitters. In configurations with multiple laser emitters, the prediction can factor the thermal power from each of the laser emitters, since they tend to heat each other. Thus, a laser emitter predicted temperature would likely be incorrect if it did not consider thermal gain from the other laser emitters.

Block 904 can obtain a desired optical power for a pixel time that the laser emitter is driven.

Block 906 can compute a compensated electrical current to drive the laser emitter for the pixel time by interpolating between light and current values for known laser emitter temperatures.

Block 908 can cause the laser emitter to be driven with the compensated electrical current such that an actual optical output of the laser emitter matches the desired optical output for the pixel time.

Various examples are described above. Additional examples are described below. One example includes a system comprising a laser that comprises a laser emitter configured to generate a laser beam, a sensor configured to sense a property of the laser, a laser emitter temperature prediction model that is configured to predict a temperature of the laser emitter from the sensed property of the laser, and a compensation and control component configured to receive a desired optical power and to compute a compensated electrical current to drive the laser based upon the predicted laser emitter temperature, the compensated electrical current computed for the predicted laser emitter temperature to cause the laser emitter to generate the laser beam having an actual optical power that matches the desired optical power.

Another example can include any of the above and/or below examples where the sensor is a thermal sensor that senses temperatures of a case of the laser.

Another example can include any of the above and/or below examples where the laser emitter temperature prediction model models thermal impedance of the laser from the laser emitter to the case.

Another example can include any of the above and/or below examples where the thermal impedance reflects elements that have a thermal relationship with the laser emitter.

Another example can include any of the above and/or below examples where the elements include another laser emitter.

Another example can include any of the above and/or below examples where the laser emitter temperature prediction model can model thermal characteristics and internal temperature of the laser over time.

Another example can include any of the above and/or below examples where the laser emitter temperature prediction model can model a particular point on the laser as a function of time and power.

Another example can include any of the above and/or below examples where the laser emitter temperature prediction model comprises multiple laser emitter temperature prediction models.

Another example can include any of the above and/or below examples where individual laser emitter temperature prediction models relate to individual elements of the laser.

Another example can include any of the above and/or below examples where the output of the individual laser emitter temperature prediction models are added together to create an overall thermal value of the laser.

Another example can include any of the above and/or below examples where the laser emitter comprises multiple laser emitters.

Another example can include any of the above and/or below examples where the laser emitter temperature prediction model considers thermal effects of individual laser emitters on one another.

Another example can include any of the above and/or below examples where the compensation and control component comprises multiple light to current look up tables (LI LUT) for individual laser emitter temperatures.

Another example can include any of the above and/or below examples where the compensation and control component comprises an interpolator that can interpolate or extrapolate from the individual laser emitter temperatures to the predicted laser emitter temperature.

Another example can include any of the above and/or below examples where the compensation and control component comprises a temperature to index look up table that shows the change in drive level needed as a percentage between or beyond the levels needed at the individual laser emitter temperatures.

Another example can include any of the above and/or below examples where the compensation and control component utilizes the percentage change to compute the compensated electrical current from the electrical current values of the individual laser emitter temperatures.

Another example includes a system comprising a laser comprising a laser emitter configured to generate a laser beam for intervals of time and a compensation and control component configured to: receive a predicted laser emitter temperature of the laser emitter, receive a desired optical power for an interval, and compute a compensated electrical current for the interval utilizing multiple light to current look up tables, wherein individual light to current look up tables relate to specific laser emitter temperatures.

Another example can include any of the above and/or below examples where the compensation and control component is configured to perform an interpolation or extrapolation from the specific laser emitter temperatures of the light to current look up tables to the predicted laser emitter temperature.

Another example can include any of the above and/or below examples where the interpolation or extrapolation is non-linear.

Another example includes a computer-implemented method comprising predicting a temperature of a laser emitter from a sum of time-dependent heat transfers though materials and interfaces of a laser containing the laser emitter, obtaining a desired optical power for a pixel time that the laser emitter is driven, computing a compensated electrical current to drive the laser emitter for the pixel time by interpolating between light and current values for known laser emitter temperatures, and causing the laser emitter to be driven with the compensated electrical current such that an actual optical output of the laser emitter matches the desired optical output for the pixel time.

The invention claimed is:

1. A system, comprising:
   a laser that comprises a laser emitter configured to generate a laser beam;
   a sensor configured to sense a temperature of a case of the laser;
   a laser emitter temperature prediction model that can model thermal impedance of the laser from the laser emitter to the case to predict a laser emitter temperature from the sensed temperature of the case of the laser; and,
   a compensation and control component configured to receive a desired optical power and to compute a compensated electrical current to drive the laser based upon the predicted laser emitter temperature, the compensated electrical current computed for the predicted laser emitter temperature to cause the laser emitter to generate the laser beam having an actual optical power that matches the desired optical power.

2. The system of claim 1, wherein the thermal impedance reflects elements that have a thermal relationship with the laser emitter.

3. The system of claim 2, wherein the elements include another laser emitter.

4. The system of claim 1, wherein the laser emitter temperature prediction model can model thermal characteristics and internal temperature of the laser over time.

5. The system of claim 4, wherein the laser emitter temperature prediction model can model a particular point on the laser as a function of time and power.

6. The system of claim 5, wherein the laser emitter temperature prediction model comprises multiple laser emitter temperature prediction models.

7. The system of claim 6, wherein individual laser emitter temperature prediction models relate to individual elements of the laser.

8. The system of claim 7, wherein the output of the individual laser emitter temperature prediction models are added together to create an overall thermal value of the laser.

9. The system of claim 1, wherein the laser emitter comprises multiple laser emitters.

10. The system of claim 9, wherein the laser emitter temperature prediction model can take into account thermal effects of individual laser emitters on one another.

11. The system of claim 1, wherein the compensation and control component comprises multiple light to current look up tables (LI LUT) for individual laser emitter temperatures.

12. The system of claim 11, wherein the compensation and control component comprises an interpolator that can interpolate or extrapolate from the individual laser emitter temperatures to the predicted laser emitter temperature.

13. The system of claim 12, wherein the compensation and control component comprises a temperature to index look up table that shows the change in electrical current drive level needed as a percentage between or beyond the electrical current drive levels needed at the individual laser emitter temperatures.

14. The system of claim 13, wherein the compensation and control component utilizes the percentage change to compute the compensated electrical current from the electrical current drive levels of the individual laser emitter temperatures.

15. A system, comprising:
   a laser comprising a laser emitter configured to generate a laser beam for intervals of time; and,
   a compensation and control component configured to:
   receive a predicted laser emitter temperature of the laser emitter,
   receive a desired optical power for an interval, and,
   compute a compensated electrical current for the interval utilizing multiple light to current look up tables, wherein individual light to current look up tables relate to specific laser emitter temperatures.

16. The system of claim 15, wherein the compensation and control component is configured to perform an interpolation or extrapolation from the specific laser emitter temperatures of the light to current look up tables to the predicted laser emitter temperature.

17. The system of claim 15, wherein the interpolation or extrapolation is non-linear.

18. A computer-implemented method, comprising:
   predicting a temperature of a laser emitter from a sum of time-dependent heat transfers through materials and interfaces of a laser containing the laser emitter;
   obtaining a desired optical power for a pixel time that the laser emitter is driven;
   computing a compensated electrical current to drive the laser emitter for the pixel time by interpolating between light and current values for known laser emitter temperatures; and,
   causing the laser emitter to be driven with the compensated electrical current such that an actual optical output of the laser emitter matches the desired optical output for the pixel time.

* * * * *